United States Patent [19]

Ichiyawa

[11] Patent Number: 5,141,148
[45] Date of Patent: Aug. 25, 1992

[54] METHOD OF ANODIC BONDING A SEMICONDUCTOR WAFER TO AN INSULATOR

[75] Inventor: Hideyuki Ichiyawa, Itami, Japan
[73] Assignee: Mitsubishi Denki Kabushiki Kaisha, Japan
[21] Appl. No.: 597,878
[22] Filed: Oct. 12, 1990

[30] Foreign Application Priority Data

Jul. 20, 1990 [JP] Japan .................. 2-190484

[51] Int. Cl.⁵ .............. B23K 35/368; H01L 35/00
[52] U.S. Cl. .................. 228/263.12; 437/21; 437/170; 65/40
[58] Field of Search ............ 228/263.12, 242; 437/170, 240, 21, 62, 75, 76; 148/DIG. 12; 65/36, 40

[56] References Cited

U.S. PATENT DOCUMENTS

| | | | |
|---|---|---|---|
| 3,316,628 | 5/1967 | Lang | 228/206 |
| 3,397,278 | 8/1968 | Pomerantz | 65/59.3 |
| 4,384,899 | 5/1983 | Myers | 29/25.41 |
| 4,452,624 | 6/1984 | Wohltjen et al. | 65/40 |
| 4,527,428 | 7/1985 | Shimada et al. | 73/721 |
| 4,746,893 | 5/1988 | Shak | 73/725 |
| 4,815,472 | 3/1989 | Wise et al. | 73/724 |
| 4,881,410 | 11/1989 | Wise et al. | 73/724 |

FOREIGN PATENT DOCUMENTS

| | | | |
|---|---|---|---|
| 2301170 | 8/1973 | Fed. Rep. of Germany | 65/40 |
| 59-174549 | 10/1984 | Japan | 65/40 |
| 62-72178 | 4/1987 | Japan | |

OTHER PUBLICATIONS

Surgan, D. H. "Sealed with a Kilovolt" *The Electronic Engineer* Sep. 1968. pp. 16-17.
Baitinger et al, "Manufacturing High-Frequency Diodes", *IBM Tech. Discl. Bulletin*, vol. 13, No. 10 Mar. 1971.

*Primary Examiner*—Richard K. Seidel
*Assistant Examiner*—Jeanne M. Elpel
*Attorney, Agent, or Firm*—Leydig, Voit & Mayer

[57] ABSTRACT

An anodic bonding method in which a semiconductor wafer and an inorganic insulating material are bonded together includes the steps of forming a first metallic thin film having a strong contact with the inorganic insulating material on one surface of the inorganic insulating material. Then, a second metallic thin film which is stable in air is formed on the first metallic thin film. The inorganic insulating material is placed on the semiconductor wafer so that a surface of the inorganic insulating material opposite the first metallic film is brought into contact with the semiconductor wafer. Then, a DC voltage is applied across the first and second metallic thin films as a cathode and the semiconductor wafer as an anode while the inorganic insulating material and semiconductor wafer are heated. Since the first metallic thin film contacts with the inorganic insulating material strongly and fills all fine gaps, voids can be prevented from occurring in bonded layers. Further, since the second metallic thin film uniformly provides an electric field, uniform bonding can be obtained with high reproducibility.

6 Claims, 2 Drawing Sheets

METHOD OF ANODIC BONDING A SEMICONDUCTOR WAFER TO AN INSULATOR

BACKGROUND OF THE INVENTION

1. Field of the Invention

The present invention relates to a method of anodic bonding and, in particular, to a method of bonding a conductor or a semiconductor wafer to an inorganic insulating material by an anodic bonding method.

2. Description of the Related Art

FIG. 1 is a cross sectional view schematically illustrating a semiconductor wafer and an inorganic insulating material being bonded by a conventional anodic bonding method. In the figure, a semiconductor wafer 1 with integrated circuits formed its surface and an inorganic insulating material 2, such as Pyrex glass, placed on the semiconductor wafer 1, are placed above a heating device 3 having a heater for heating these materials. A cathode 5 connected to a cathode terminal 4 is pressed against the inorganic insulating material 2. The semiconductor wafer 1 acts as an anode, to which an anode terminal 6 is electrically connected. The semiconductor wafer 1, the inorganic insulating material 2, bonded by a conventional anodic bonding method, are constructed as mentioned above and the bonding of these materials is performed as described below. First, the semiconductor wafer 1 and the inorganic insulating material 2 placed above the heating device 3 are heated by the heating device 3 to between 200° and 400° C. Next, a DC voltage of 300 to 800 V is applied between the anode terminal 6 and the cathode terminal 4. The application of the DC voltage causes ions in the inorganic insulating material 2 to move. The close contact between the wafer 1 and insulating material 2 caused by an electrostatic attracting force spreads concentrically directly under and with the cathode 5 as a center, and an oxide film is formed in the interface between the semiconductor wafer 1 and the inorganic insulating material 2, as a result of the diffusion of oxygen, and is bonded.

An anodic bonding method mentioned above is often performed in a vacuum. Because heat is dissipated in a vacuum, a difference in temperature of approximately 20° to 50° C. occurs between the heating temperature of a heater or the like and a bonding interface and the surface of the inorganic insulating material 2 (which in this case refers to the surface on which the cathode 5 is disposed). For this reason, a thermal stress occurs within the inorganic insulating material 2, and in order to increase the temperature of the entire inorganic insulating material 2 to a temperature at which the ions within the inorganic insulating material 2 can move, the temperature of the heating device 3 must be set higher. Hence, warping or residual stress may occur in the semiconductor wafer 1 and the inorganic insulating material 2. Since electric fields are concentrated in the cathode 5, the residual stress is larger in the vicinity of the cathode 5. Thus, in attempting to minimize the size of the area in which the residual stress is received after bonding by making the area of the cathode 5 smaller, as shown in FIG. 2, the cathode 5 is sometimes disposed at the outer periphery of the semiconductor wafer 1. Even in this case, however, there occurs a problem in that there is a stress distribution with the position of the cathode 5 as a peak, so that a uniform bonding cannot be performed and a bonding speed is slow. Hence, to up the bonding speed, as shown in FIG. 3, the area of a cathode 7 is made larger. In this case, the cathode 7 is an electrode having a thickness of several mm, for example, of stainless steel and it is removed from the inorganic insulating material 2 after bonding is terminated. However, fine gaps may occur between the cathode 7 and the inorganic insulating material 2. In such a state, a voltage will not be applied uniformly. Problems arise in that voids occur between the semiconductor wafer 1 and the inorganic insulating material 2 which have been bonded, or the bonding becomes non-uniform, and further the amount of warping becomes larger.

SUMMARY OF THE INVENTION

The present invention has been devised to eliminate the above-mentioned problems. An object of the present invention is to provide a method of bonding an anode in which the time for bonding is very short, no voids occur in bonded layers, and bonding produces only a uniform small residual stress.

In order to achieve the above objects, according to one aspect of the present invention, there is provided an anodic bonding method in which a semiconductor wafer and an inorganic insulating material are bonded comprising the steps of: forming a metallic thin film having a strong contact with the inorganic insulating material on one surface of the inorganic insulating material; placing a semiconductor wafer on a heating device; placing the inorganic insulating material on the semiconductor wafer so that a surface of the inorganic insulating material without the metallic film is brought into contact with the semiconductor wafer; and applying a DC voltage across the metallic thin film as a cathode and the semiconductor wafer as an anode while the semiconductor wafer and the inorganic insulating material are heated.

According to another aspect of the present invention, there is provided an anodic bonding method in which a semiconductor wafer and an inorganic insulating material are bonded comprising the steps of: forming a first metallic thin film having a strong contact with the inorganic insulating material on one surface of the inorganic insulating material; forming a second metallic thin film which is stable in air and having excellent electrical conductivity on the first metallic thin film; placing a semiconductor wafer on a heating device; placing the inorganic insulating material on the semiconductor wafer so that the other surface of the inorganic insulating material is brought into contact with the semiconductor wafer; and applying a DC voltage across two electrodes with the first and second metallic thin films used as cathodes and the semiconductor wafer used as an anode while the inorganic insulating material and the semiconductor wafer are heated.

These and other objects, features and advantages of the present invention will become clear when reference is made to the following description of the preferred embodiments of the present invention, together with reference to the accompanying drawings.

DESCRIPTION OF THE PREFERRED EMBODIMENTS

Figure 1:
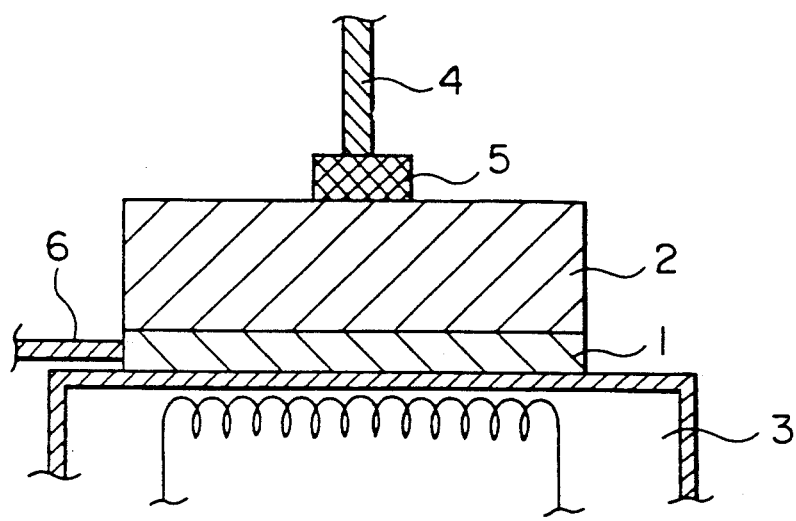
FIGS. 1 to 3 are cross sectional views schematically illustrating a semiconductor wafer and an inorganic insulating material bonded by a conventional anodic bonding method.
Figure 2:
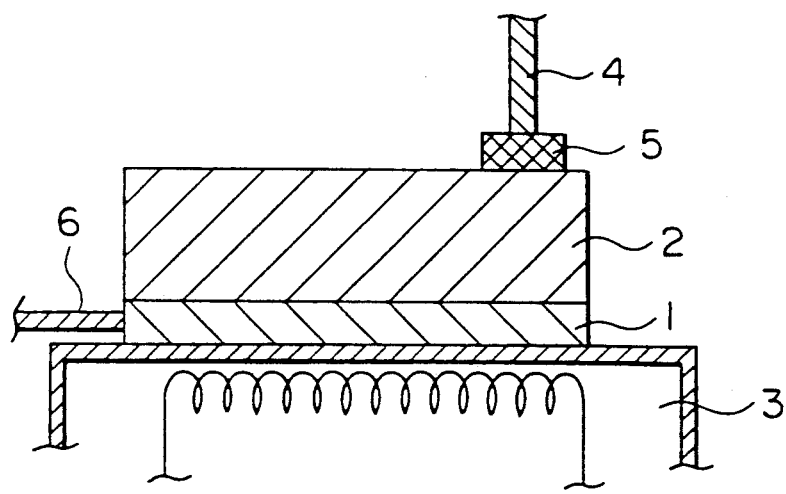
Figure 3:
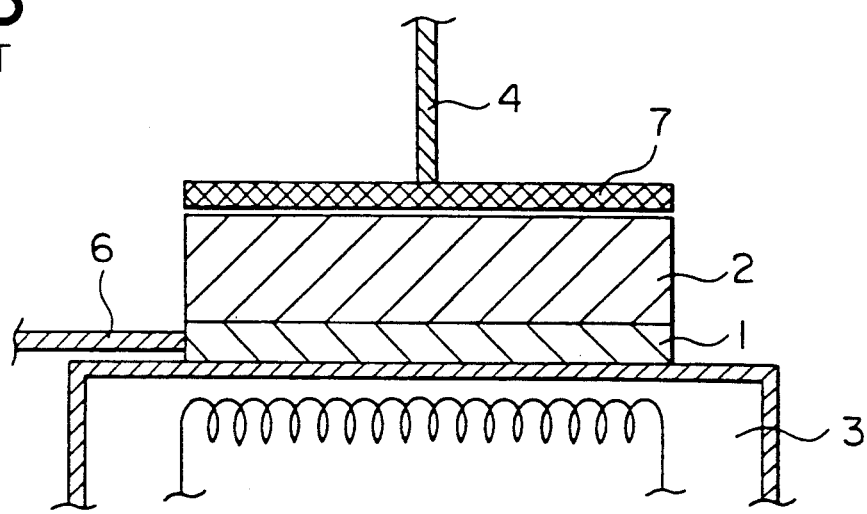
Figure 4:
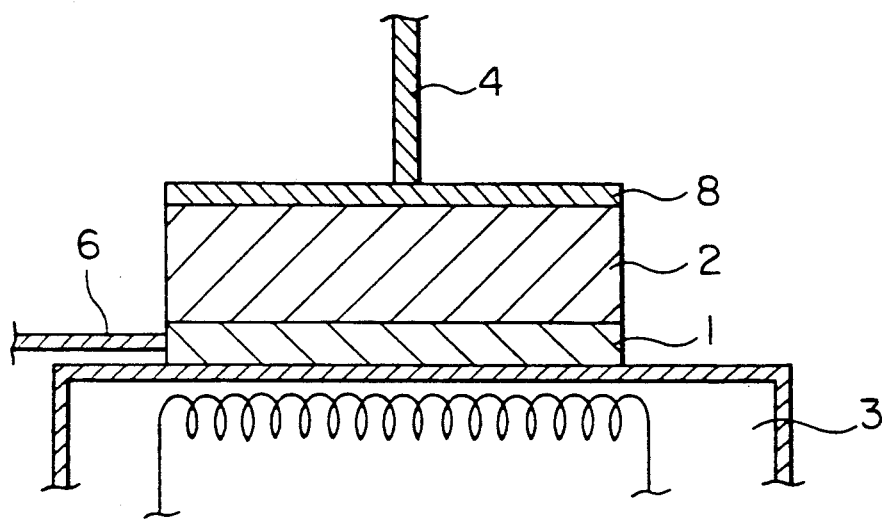
FIG. 4 is a cross sectional view schematically illustrating a semiconductor wafer and an inorganic insulating material being bonded according to an embodiment of the present invention.

FIG. 4 is a cross sectional view schematically illustrating a semiconductor wafer and an inorganic insulating material being bonded according to an embodiment of the present invention. Numerals 1 to 4, and 6 denote the exact same parts as those used in the above-mentioned conventional anodic bonding method. On the entire surface of the inorganic insulating material 2, opposite to the surface on which the inorganic insulating material 2 is bonded, is formed a metallic thin film 8 having a strong contact with the inorganic insulating material 2, such as chromium (Cr), gold (Au). The cathode terminal 4 is electrically connected and pressed against the metallic thin film 8 as a cathode. Regarding the inorganic insulating material 2, glass in which ions move by heating, for instance, Pyrex glass (product name manufactured by Corning Corp.) can preferably be used.

In the method of bonding an anode of the present invention, first, for example, a Cr thin film, is formed uniformly to a thickness of approximately 500 to 1500Å by sputtering on one surface of the inorganic insulating material 2. Next, the surface opposite to the surface on which this Cr thin film is formed is placed on a conductor (in this case, the semiconductor wafer 1) and heated to a temperature of approximately 200° to 300° C. The anode terminal 6 and the metallic thin film 8 are electrically connected to the semiconductor wafer 1 and the cathode terminal 4, respectively, and a DC voltage of 300 to 500 V is applied across the terminals. As a result, close contact, because of an electrostatic attracting force, occurs within about two minutes, for example, over the entire surface of a semiconductor wafer having a diameter of approximately 10 cm (4 inches). Further, if it is maintained in this heated, electrically conducting state for about 5 to 15 min., the semiconductor wafer 1 and the inorganic insulating material 2 are bonded strongly and uniformly by the anodic bonding method.

Figure 5:
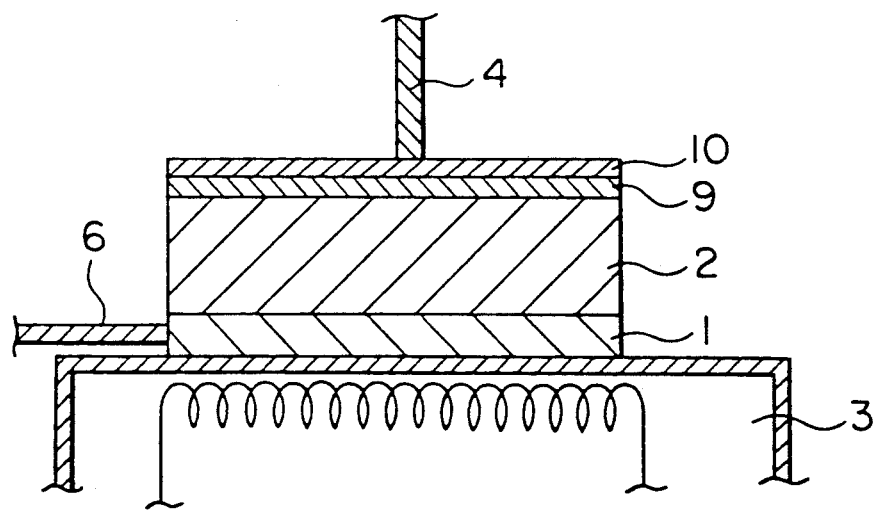
FIG. 5 is a cross sectional view schematically illustrating a semiconductor wafer and an inorganic insulating material being bonded according to another embodiment of the present invention.

In the above-mentioned embodiment, the metallic thin film 8 is formed on the surface opposite to the surface on which the semiconductor wafer 1 is bonded. As shown in FIG. 5, a metal having close contact with the inorganic insulating material 2, for instance, a first metallic thin film 9, such as titanium (Ti), chromium (Cr), zirconium (Zr), is formed as the first layer in place of the metallic thin film 8. A metal which is stable in air (will not be oxidized at high temperatures) and having electrical conductivity, for instance, nickel (Ni), cobalt (Co), molybdenum (Mo), gold (Au), silver (Ag), platinum (Pt), is formed on the first metallic thin film 9 as the second layer 10. Anodic bonding may be performed with the first and second metallic thin films 9 and 10 as a cathode. In this case, a Ti thin film, for example, is formed uniformly to a thickness of approximately 500Å by sputtering on one surface of Pyrex glass, and on this Ti thin film is formed, for example, a Ni thin film having a thickness of approximately 1000 to 1500Å.

The thicknesses of the metallic thin films 8 to 10 should be those in which contact and electrical conductivity with the inorganic insulating material 2 is achieved, and a desired thickness can be suitably chosen. The metallic thin films 8 to 10 may be left after bonding as they are formed on the inorganic insulating material 2, or may be removed.

In the above-mentioned embodiment, Pyrex glass is used as the inorganic insulating material 2. However, other glass such as boro-silicate glass or others may also be used. Further, a semiconductor wafer may be used as the inorganic insulating material 2 and the semiconductor wafers may be bonded, which shows the same effects as are described above.

As has been explained above, according to the present invention, a metallic thin film having a very strong contact with an inorganic insulating material is formed on the entire surface opposite to the surface on which the inorganic insulating material is bonded, and a DC voltage is applied across two electrodes in with this metallic thin film as a cathode and a semiconductor wafer as an anode. Therefore, bonding can be performed at very high speeds. Also, since a metallic thin film having a uniform deposition surface is used, no fine gaps exist between a cathode and when a semiconductor wafer and an electric field is applied, uniform bonding can be obtained with high reproducibility. Further, since only an electrode terminal pressed against the metallic thin film, the bonding operation can be easily automated and manufacturing simplified.

In addition, where bonding is performed in vacuum, there exists an advantage in that the dissipation of heat is shielded since a metallic thin film is formed on the surface layer of an inorganic insulating material. Even when the temperature of bonding is lowered, excellent bonding is possible and adverse influences, such as thermal stress, can be reduced. Accordingly, semiconductor devices having high accuracy can be manufactured and yield can be improved considerably. In the Ni thin film used as the second metallic thin film, an oxide film is formed on its surface as a result of the heat applied at bonding. This oxide film advantageously has a strong contact with die-bond materials (silicone rubber and epoxy resin) used in an assembling semiconductor devices and, therefore high-quality semiconductor devices can be manufactured.

Many widely different embodiments of the present invention can be made without departing from the spirit and scope thereof, therefore, it is to be understood that this invention is not limited to the specific embodiments described but by the appended claims.

What is claimed is:

1. An anodic bonding method in which a semiconductor wafer and an inorganic insulating material are bonded together consisting of:
    forming a film consisting of a single metal layer on the entire area of a surface of an inorganic insulating material;
    placing said inorganic insulating material on a semiconductor wafer so that a surface of the inorganic insulating material opposite the film is brought into contact with the semiconductor wafer; and
    apply a DC voltage across said film as a cathode and said semiconductor wafer as an anode while said semiconductor wafer and said inorganic insulating material are heated whereby the inorganic insulating material and the semiconductor wafer are bonded together.

2. The anodic bonding method as claimed in claim 1, wherein said film is selected from the group consisting of chromium and gold.

3. An anodic bonding method as claimed in claim 1, wherein said inorganic insulating material is Pyrex glass.

4. An anodic bonding method in which a semiconductor wafer and an inorganic insulating material are bonded together consisting of:
   forming a first film consisting of a first metal layer on the entire are of a surface of an inorganic insulating material;
   forming a second film consisting of a second metal layer which is stable in air on the first film;
   placing said inorganic insulating material on a semiconductor wafer so that a surface of the inorganic insulating material opposite the first film is brought into contact with the semiconductor wafer; and
   apply a DC voltage across said first and second films as a cathode and said semiconductor wafer as an anode while said semiconductor wafer and said inorganic insulating material are heated whereby the inorganic insulating material and the semiconductor wafer are bonded together.

5. An anodic bonding method as claimed in claim 4, wherein said first film is selected from the group consisting of titanium, chromium, and zirconium.

6. An anodic bonding method as claimed in claim 4, wherein said second film is selected from the group consisting of nickel, cobalt, molybdenum, gold, silver, and platinum.

* * * * *

UNITED STATES PATENT AND TRADEMARK OFFICE
CERTIFICATE OF CORRECTION

PATENT NO. : 5,141,148

DATED : August 25, 1992

INVENTOR(S) : Hideyuki Ichiyawa

It is certified that error appears in the above-identified patent and that said Letters Patent is hereby corrected as shown below:

Claim 4, column 5, line 10, change "are" to --area--.

Claim 4, column 6, line 3, change "apply" to --applying--.

Signed and Sealed this

Twenty-first Day of September, 1993

*Attest:*

BRUCE LEHMAN

*Attesting Officer*     *Commissioner of Patents and Trademarks*